United States Patent [19]

Kuramochi

[11] Patent Number: 5,654,590
[45] Date of Patent: Aug. 5, 1997

[54] MULTICHIP-MODULE HAVING AN HDI AND A TEMPORARY SUPPORTING SUBSTRATE

[75] Inventor: Toshiyuki Kuramochi, Kawasaki, Japan

[73] Assignee: Fujitsu Limited, Kawasaki, Japan

[21] Appl. No.: 593,337

[22] Filed: Jan. 29, 1996

Related U.S. Application Data

[62] Division of Ser. No. 297,559, Aug. 31, 1994, Pat. No. 5,521,122.

[30] Foreign Application Priority Data

Dec. 27, 1993 [JP] Japan ................................. 5-333354

[51] Int. Cl.⁶ .............................. H01L 23/48; H01L 23/52
[52] U.S. Cl. ................... 257/778; 257/723; 257/668; 257/700; 257/774; 257/758
[58] Field of Search .............................. 437/195, 215, 437/915; 257/668, 700, 774, 758; 361/414; 29/852

[56] References Cited

U.S. PATENT DOCUMENTS 5,192,716  3/1993  Jacobs ................................. 437/209

*Primary Examiner*—Mahshid D. Saadat
*Assistant Examiner*—T. M. Arroyo
*Attorney, Agent, or Firm*—Armstrong, Westerman, Hattori, McLeland & Naughton

[57] ABSTRACT

A multichip-module fabrication method includes the step of forming a chip-mounting substrate by forming a bonding layer on a supporting base and by forming one or a plurality of interconnection layers in a stack formation on the bonding layer via insulating layers. This method also includes the step of forming one or a plurality of throughholes extending through the insulating layers to the bonding layer on the chip-mounting substrate. Subsequently, this method separates the supporting base from the chip-mounting substrate by leading a treatment medium which is capable of removing the bonding layer to the bonding layer at least through one or a plurality of the throughholes. Finally, by mounting a semiconductor chip on the chip-mounting substrate, the multichip-module fabrication method is completed.

2 Claims, 10 Drawing Sheets

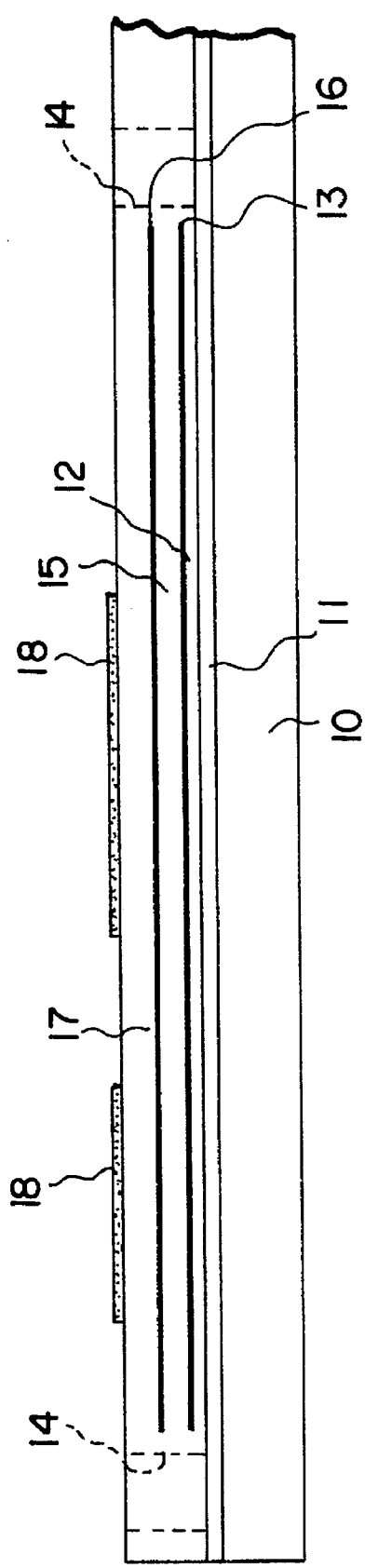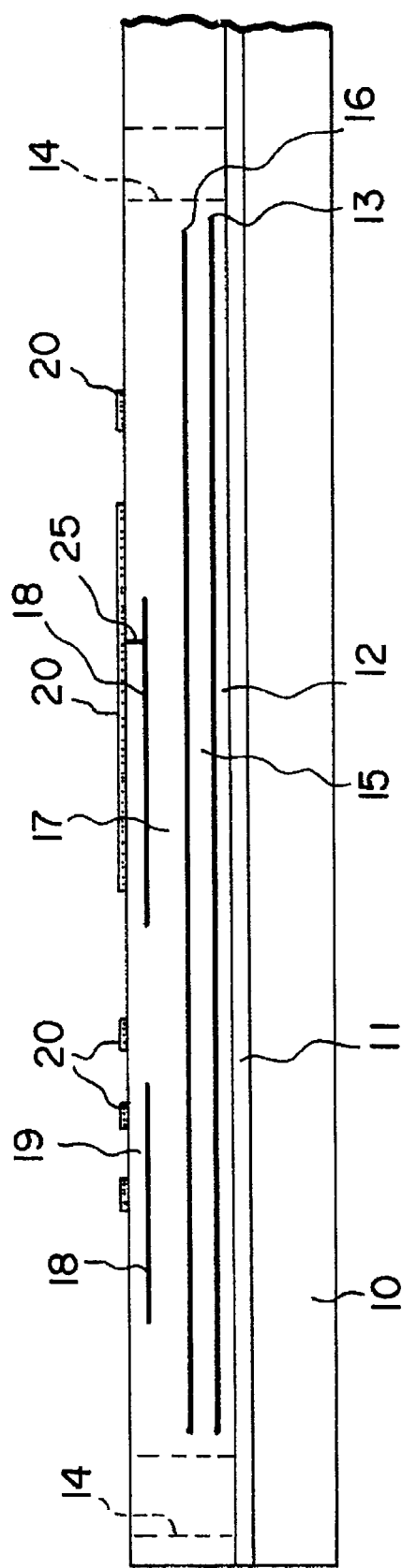

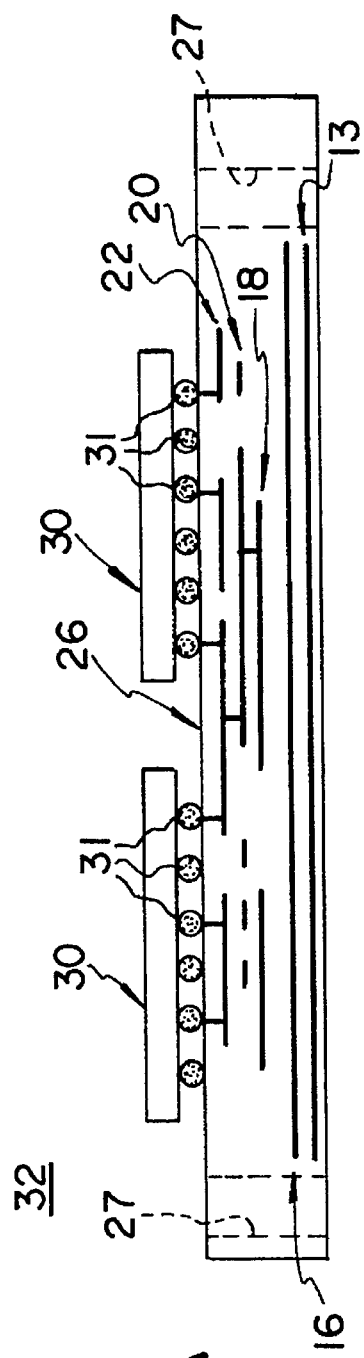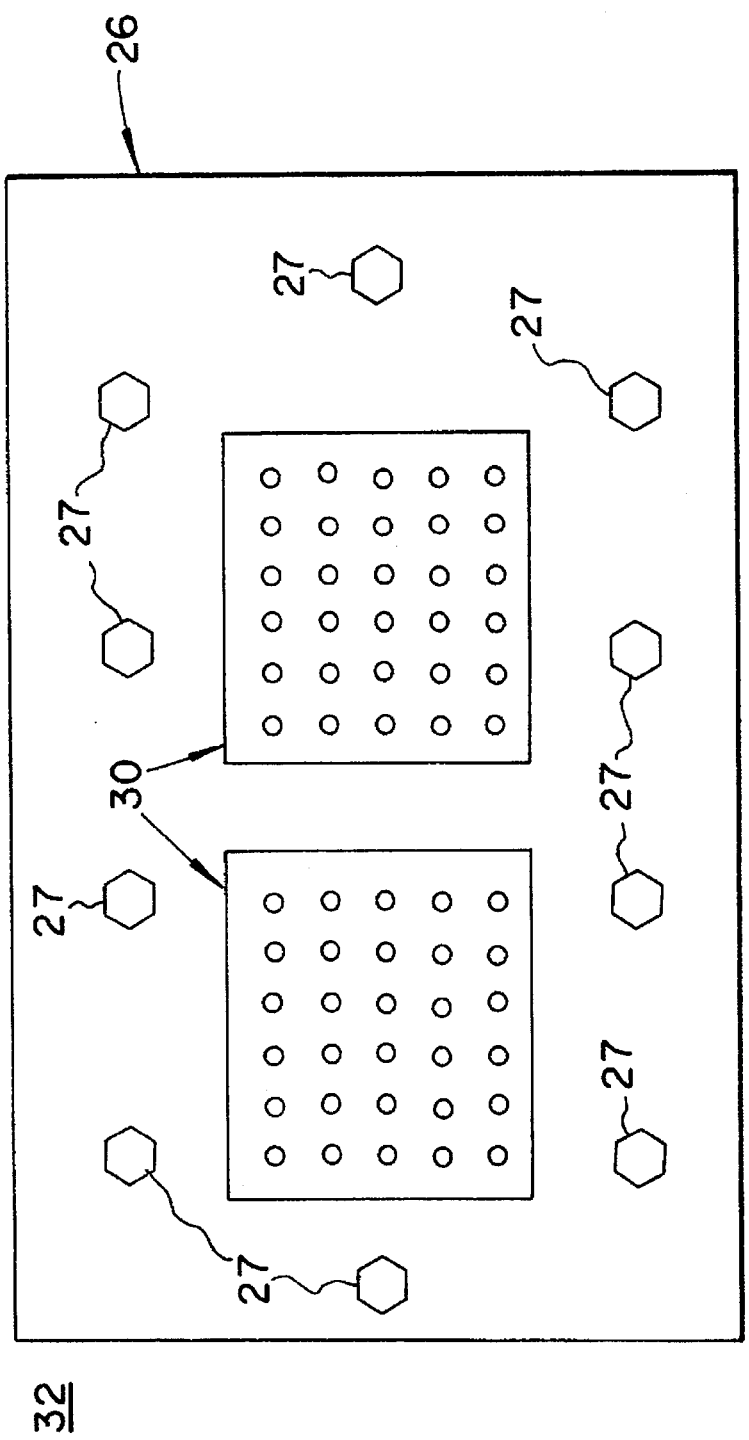
FIG. 13A
FIG. 13B

FIG. 14

- FORMING OF A BONDING LAYER ON A SUPPORTING BASE
- FORMING OF A FIRST INSULATING LAYER ——— • DEPOSITION OF THE INSULATING LAYER
- FORMING OF A FIRST INTERCONNECTION LAYER
  - • DEPOSITION OF A CONDUCTIVE LAYER
  - • PATTERNING
- FORMING OF A SECOND INSULATING LAYER
  - • DEPOSITION OF THE INSULATING LAYER
  - • PATTERNING (WITH THROUGHHOLE)
- FORMING OF A SECOND INTERCONNECTION LAYER
  - • DEPOSITION OF A CONDUCTIVE LAYER
  - • PATTERNING
- FORMING OF A THIRD INSULATING LAYER
  - • DEPOSITION OF THE INSULATING LAYER
  - • PATTERNING (WITH THROUGHHOLE)
- FORMING OF A THIRD INTERCONNECTION LAYER
  - • DEPOSITION OF A CONDUCTIVE LAYER
  - • PATTERNING
- FORMING OF A FOURTH INSULATING LAYER
  - • DEPOSITION OF THE INSULATING LAYER
  - • PATTERNING (WITH THROUGHHOLE)
- FORMING OF A FOURTH INTERCONNECTION LAYER
  - • DEPOSITION OF A CONDUCTIVE LAYER
  - • PATTERNING
- FORMING OF A FIFTH INSULATING LAYER
  - • DEPOSITION OF THE INSULATING LAYER
  - • PATTERNING (WITH THROUGHHOLE)
- FORMING OF A FIFTH INTERCONNECTION LAYER
  - • DEPOSITION OF A CONDUCTIVE LAYER
  - • PATTERNING
- FORMING OF A SIXTH INSULATING LAYER
  - • DEPOSITION OF THE INSULATING LAYER
  - • PATTERNING (WITH THROUGHHOLE)
- FORMING OF A SURFACE-CONDUCTIVE LAYER
  - • DEPOSITION OF A CONDUCTIVE LAYER
  - • PATTERNING
- SEPARATION OF A SUPPORTING BASE

MULTICHIP-MODULE HAVING AN HDI AND A TEMPORARY SUPPORTING SUBSTRATE

This is a division of application Ser. No. 08/297,559 filed Aug. 31, 1994, now U.S. Pat. No. 5,821,122.

BACKGROUND OF THE INVENTION

1. Field of the Invention

The present invention generally relates to a multichip-module fabrication method and a multichip module, and more particularly, to a multichip-module fabrication method and a multichip module in which a chip-mounting substrate is supported by a supporting base during a fabrication process of the multichip module.

Recently, to meet demands for higher-speed and higher-density in computers, a multichip-module is often utilized, in which semiconductor chips in the form of bare chips are directly mounted on the chip-mounting substrate.

Because mechanical strength of the chip-mounting substrate itself is weak, in the fabrication process of the multichip module, the chip-mounting substrate is mechanically reinforced by forming the supporting base in contact with a face of the chip-mounting substrate.

And the supporting base becomes unnecessary in a completed multichip module, so that the multichip-module fabrication process comprises a process which removes the supporting base from the chip-mounting substrate.

Therefore, in the removing process, in order to improve chip yield, it is important to carry out the removing process without damaging other components such as interconnection layers formed in the chip-mounting substrate.

2. Description of the Prior Art

FIGS. 1A, 1B show a process that removes a supporting base 2 from a chip-mounting substrate 1 (mother board) by means of a prior fabrication process of a multichip-module. As shown in FIG. 1A, the chip-mounting substrate 1 is constructed in the form that given-pattern interconnection layers 4 made of a conductive metal (ex. copper) are layered within an interlayer-insulating film 3 such as polyimide or BCB (benzocyclobutane). The supporting base 2 is made of, for example, silicon (Si), and is fixed to a bottom of the chip-mounting substrate 1.

As described above, the chip-mounting substrate 1 is constructed in the form that the interconnection layers 4 formed with the conductive films are layered within the interlayer-insulating film 3 which is mainly made with resinous materials, and thus the chip-mounting substrate 1 may be easily bent due to its weak mechanical structure. Then, when utilizing the chip-mounting substrate 1 without the supporting base 2, the chip-mounting substrate 1 may be bent during a fabrication process of the interlayer-insulating film 3 and the interconnection layers 4, and each of the layers will not be formed without damage.

Therefore, in the fabrication process of the multichip module, it is general practice that the chip-mounting substrate 1 is mechanically reinforced by forming the supporting base 2 in contact with the bottom face of the chip-mounting substrate 1.

And as the supporting base 2 is formed for the purpose of only reinforcement of the chip-mounting substrate 1, the supporting base 2 becomes unnecessary after completion of the multichip module. Thus, the multichip-module fabrication process comprises a supporting-base removing process that removes the supporting base 2 from the chip-mounting substrate 1.

In a conventional method, in order to remove the supporting base 2 from the chip-mounting substrate 2, the chip-mounting substrate 1 with the supporting base 2 is dipped in an etching pool filled with an etching medium. Subsequently, the supporting base 2 is removed from the chip-mounting substrate 1 by etching the supporting base 2. FIG. 1B shows the chip-mounting substrate 1 from which the supporting base 2 has been removed.

For ensuring support,of the chip-mounting substrate 1 in each fabrication process of the multichip module, a thickness of about 650 μm for the supporting base 2 is required. In order to entirely remove the supporting base 2, which has a relatively thick width, by means of etching, the chip-mounting substrate 1 with the supporting base 2 is generally needed to be dipped into the etching medium for about 24 hours.

The reason why it takes such a long time for the etching, is that the etching medium does not permeate a bonding section between the chip-mounting substrate 1 and the supporting base 2, and is also that the supporting base 2 is eroded from around the section (5 area) except this bonding section. Therefore, the etching process needs to be continued until the supporting base 2 is completely etched.

However, such a long time dip of the chip-mounting substrate 1 through the etching medium may cause that the etching medium to permeate among layers of the chip-mounting substrate 1 having a layer structure. Under this condition, as shown in FIG. 2, conductive-metal materials constructing the interconnection layers 4 may be disconnected with corrosion due to the permeated etching medium, and detachment in the interlayer-insulating film 3 may occur. As a result, a fabrication yield of the chip-mounting substrate 1 becomes low, and it causes a problem that fabrication efficiency and its stability are degraded.

SUMMARY OF THE INVENTION

It is an object of this invention to provide a multichip-module fabrication method and a multichip module which enables improvement of efficiency and stability during the fabricating the multichip module, in which the disadvantages described above are eliminated.

The object described above is achieved by a multichip-module fabrication method comprising a chip-mounting-substrate forming process for forming a chip-mounting substrate by forming a bonding layer on a supporting base and by forming single or plural interconnection layers in the form of layers on the bonding layer via insulating layers, a throughhole-forming process for forming a throughhole through the insulating layers to the top of the bonding layer on the chip-mounting substrate, a supporting-base separating process for separating the supporting base from the chip-mounting substrate by pouring treatment medium which is capable of removing the bonding layer to the bonding layer at least through the throughhole, and a chip-mounting process for mounting semiconductor chips on the chip-mounting substrate.

The object described above is also achieved by a multichip-module fabrication method, wherein the chip-mounting-substrate forming process and the throughhole-forming process are carried out together by forming the throughhole during forming of the insulating layers.

The object described above is further achieved by a multichip-module fabrication method, wherein, in the throughhole-forming process, a plurality of the throughholes are formed, and a total number (n) of the throughholes formed in the chip-mounting substrate and each number ($n_a$, $n_b$) of the throughhole allocated in two neighboring sides of the chip-mounting substrate are set in accordance with following equations:

$$n > (a \cdot b - \Sigma_0)/(\pi \cdot (1-\epsilon \cdot t)^2);$$

$$n_a < a/(2 \cdot (1+\epsilon \cdot t));\text{ and}$$

$$n_b < b/(2 \cdot (1+\epsilon \cdot t));$$

where a is length of one side the chip-mounting substrate, b is length of the neighboring side of the chip-mounting substrate, $\Sigma_0$ is a minimum bonding area of the bonding layer, $\epsilon$ is reaction speed of the treatment medium, and t is a reaction time of the treatment medium.

The object described above is also achieved by a multichip-module fabrication method, wherein the bonding layer and the supporting base are constructed as one member by forming the bonding layer using the same materials as that of the supporting base.

In addition, the object described above is achieved by a multichip module comprising a semiconductor chip, and a chip-mounting substrate mounting the semiconductor chip, wherein a throughhole is formed in the chip-mounting substrate, a treatment medium is leaded into the throughhole for separating a supporting base from the chip-mounting substrate, and the supporting base supporting the chip-mounting substrate during forming of the chip-mounting substrate.

According to the multichip-module fabrication method, the throughhole is formed through the insulating layers to the top of the bonding layer in the throughhole-forming process, so that the treatment medium for removing of the bonding layer can react with the bonding layer through the throughhole in the supporting-base separating process. The above enables separation of the supporting base from the chip-mounting substrate by only removing the bonding layer with the treatment medium, and the separation may be completed for a short time. Therefore, the above separation processing can be completed before the treatment medium permeates into the interlayer-insulating film being a component of the chip-mounting substrate, and thus these results enable sure prevention of the detachment between the interlayer-insulating films and the disconnection in the interconnection layers.

And according to the multichip-module fabrication method, the chip-mounting-substrate forming process and the throughhole-forming process are carried out together by forming the throughhole during forming of the interconnection layers in the form of layer, so that the above enables simplification of the multichip-module fabrication process.

And according to the multichip-module fabrication method, during forming of a plurality of the throughholes, a total number (n) of the throughholes formed in the chip-mounting substrate and each number ($n_a$, $n_b$) of the throughholes allocated in two neighboring sides of the chip-mounting substrate are set to calculated numbers according to the given equations, consequently in the each multichip-module fabrication process the chip-mounting substrate is strongly supported by the supporting base, and in the supporting-base separating process the separation of the supporting base from the chip-mounting substrate may be carried out for a short time.

And according to the multichip-module fabrication method, the bonding layer and the supporting base are constructed as one member by forming the bonding layer with the same materials as that of the supporting base, so that a structure of the chip-mounting substrate with which the supporting base is in contact may be simplified.

Further according to the multichip module, the throughholes are formed in the chip-mounting substrate, the treatment medium for removal of the supporting base from the chip-mounting substrate is leaded into these throughholes, where the supporting base supports the chip-mounting substrate during forming the chip-mounting substrate, so that the detachment between the interlayer-insulating films and the disconnection in the interconnection layer may be surely prevented.

Other objects and further features of the present invention will be apparent from the following detailed description when read in conjunction with the accompanying drawings.

BRIEF DESCRIPTION OF THE DRAWINGS

FIG. 6 is a cross-sectional view of the multichip module showing the first embodiment of the multichip-module fabrication method in an order of each process according to the present invention;

FIG. 7 is a cross-sectional view of the multichip module showing the first embodiment of the multichip-module fabrication method in an order of each process according to the present invention;

FIG. 13A and FIG. 13B are respectively a cross-sectional view and a top view of the multichip module being fabricated by means of the first embodiment of the multichip-module fabrication method according to the present invention;

FIG. 14 is a flow chart for explaining fabrication procedures of the first embodiment of the multichip-module fabrication method according to the present invention.

DESCRIPTION OF THE PREFERRED EMBODIMENTS

First, a description will be given of a first embodiment of a multichip-module fabrication method according to the present invention, by referring to FIGS. 3 to 14. FIGS. 3 to 13 show cross-sectional views of the multichip module describing the fabrication process of the multichip module. FIG. 14 shows a fabrication procedure of the multichip module. By referring to each figure, the multichip-module fabrication method will be explained in the order of each process in the following.

Figure 1A:
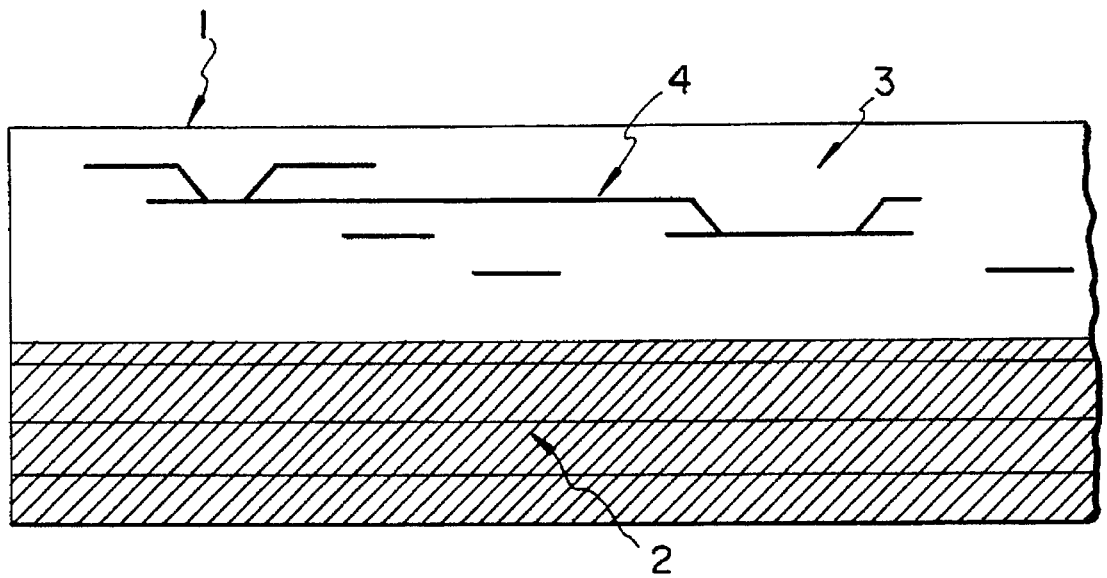
FIG. 1A and FIG. 1B are a diagram for explaining one of prior art multichip-module fabrication methods.
Figure 1B:
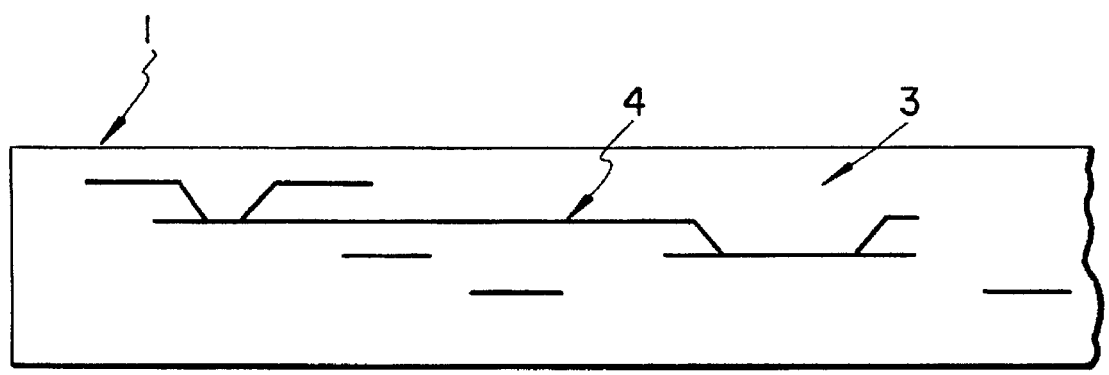
Figure 2:
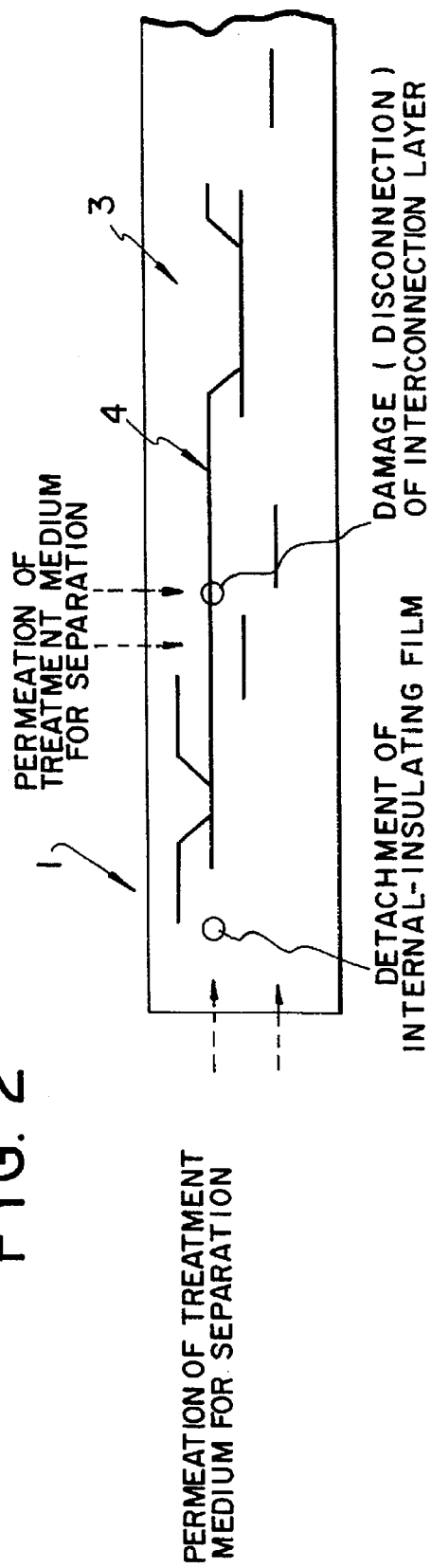
FIG. 2 is a diagram for explaining problems existing in the prior art multichip-module fabrication method.
Figure 3:
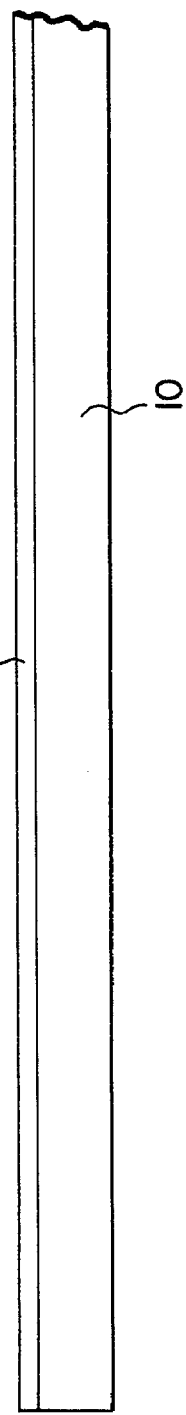
FIG. 3 is a cross-sectional view of a multichip module showing a first embodiment of a multichip-module fabrication method in an order of each process according to the present invention.

For fabricating a multichip module, as shown in FIG. 3, a bonding layer 11 is formed over a supporting base 10. For the supporting base 10, materials such as silicon (Si), aluminum, and epoxy resin are usable. And a variety of materials for the bonding layer 11 is usable in accordance with a kind of materials and a hardening temperature for a later mentioned interlayer-insulating film.

However, in general, inorganic materials such as silicon oxide film ($SiO_2$), phosphorus glass, soda glass, and lead (Pb) glass for the bonding layer 11 are usable independent of the kind of materials and the hardening temperature. And in the case that the hardening temperature of the interlayer-insulating film is not so high (under 450° C.), epoxy resin is usable as a main material of the bonding layer. In the case that silicon is used for the supporting base's material, and bonding material of the silicon family is used for the bonding layer's material, it is possible to construct the supporting base 10 and the bonding layer 11 as one member.

Figure 4:
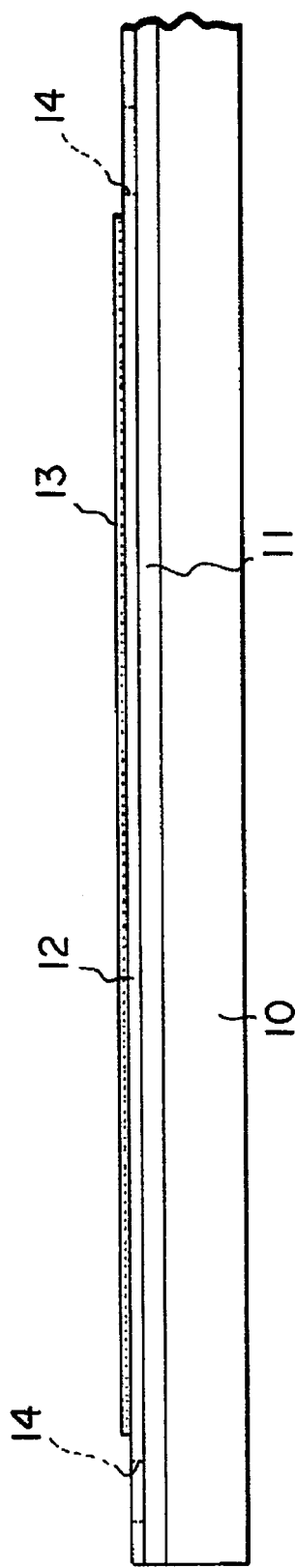
FIG. 4 is a cross-sectional view of the multichip module showing the first embodiment of the multichip-module fabrication method in an order of each process according to the present invention.

After formation of the bonding layer 11, as shown in FIG. 4, a first insulating layer 12 is disposed over the bonding layer 11, and subsequently a first interconnection layer 13 is formed over the first insulating layer 12. For the first insulating layer 12, if the supporting base is for instance silicon substrate, an insulated material of the silicon family can be suitably applied.

This first insulating layer 12 is deposited by means of such as an evaporation method and/or spin coat method. During formation of the first insulating layer 12, plural holes (two holes appear in FIG. 4) are simultaneously formed at a given spaced-apart location from each other in a location where a later-mentioned detaching medium is leaded (this location is referred to as "throughhole forming location", hereinbelow). The holes 14 may be easily formed by disposing such as a mask on the throughhole forming location at the time of depositing the first insulating layer 12 with the evaporation method. A first interconnection layer 13, such as a copper (Cu) film is formed over the first insulating layer 12 in the form of a film, and next a given pattern is formed by means of a lithographic technology.

In this embodiment, a 5-interconnection-layer structure is described. The 5-interconnection-layer structure is constructed in order by repeating the same forming process as that of the above-described first insulating layer 12 and the first interconnection layer 13. In the following, a description of the forming process of each layer will be simply given, because the forming process of each layer is the same as that of the first insulating layer 12 and the first interconnection layer 13.

Figure 5:
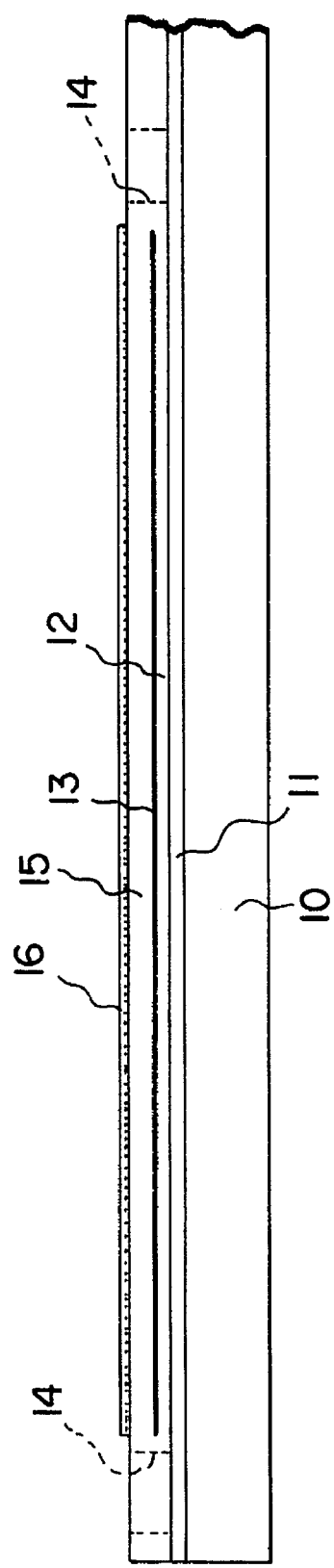
FIG. 5 is a cross-sectional view of the multichip module showing the first embodiment of the multichip-module fabrication method in an order of each process according to the present invention.

As mentioned above, after the first interconnection layer 13 is formed, a second insulating layer 15, as shown in FIG. 5, is formed, and subsequently a second interconnection layer 16 is formed over that. In addition, during formation of the second insulating layer 15, the hole 14 is formed at the throughhole forming location. Thus, the relationship between the hole 14 formed in the first insulating layer 12 and the hole 14 formed in the second insulating layer 15 is coaxial (in FIG. 5, a coaxial hole is labeled "14", which is formed in each of the insulating layers 12, 15).

Further, repetition of the same process as described above forms layers as follows: a third insulating layer 17 and a third interconnection layer are formed as shown in FIG. 6, and next a fourth insulating layer 19 and a fourth interconnection layer 20 are formed as shown in FIG. 7, finally a fifth insulating layer 21 and a fifth interconnection layer 22 being formed in FIG. 8.

Figure 9:
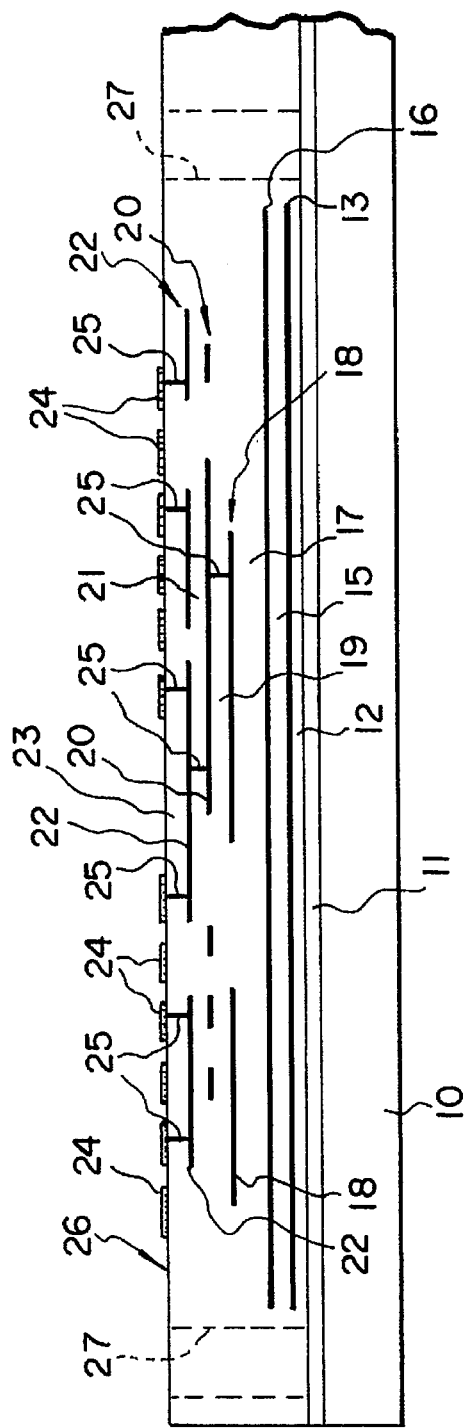
FIG. 9 is a cross-sectional view of the multichip module showing the first embodiment of the multichip-module fabrication method in an order of each process according to the present invention.

After formation of the fifth insulating layer 21 and the fifth interconnection layer 22, a sixth insulating layer 23 as shown in FIG. 9, is formed over their layers 21, 22, and subsequently a surface-conductive layer 24 which is to be connected to a bump 31 formed in the semiconductor chips 30 is formed over the sixth insulating layer 23. Further, during formation of the sixth insulating layer 23, the hole 14 is formed at the throughhole forming location.

Figure 8:
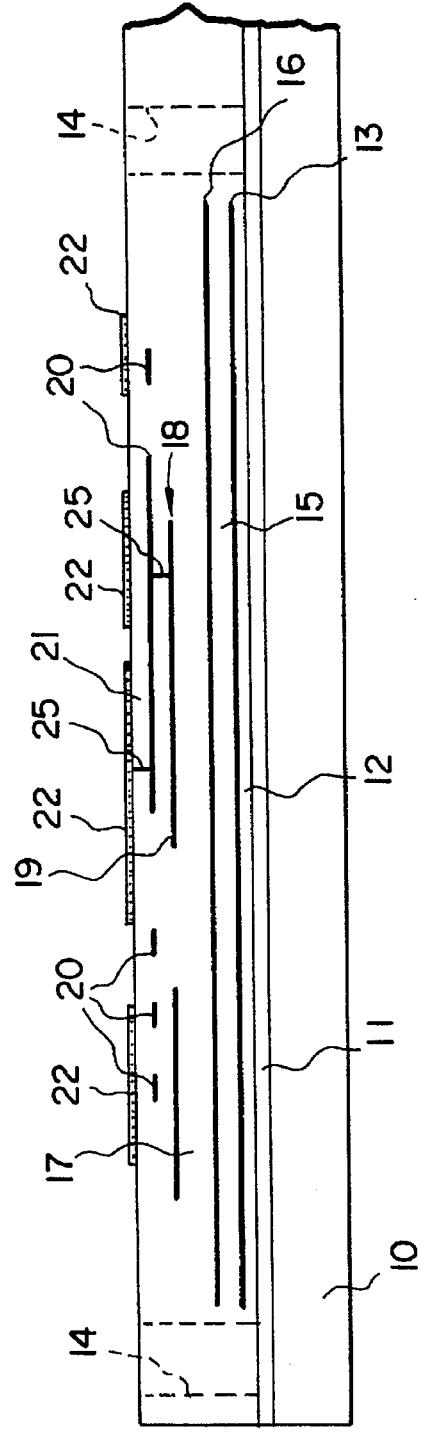
FIG. 8 is a cross-sectional view of the multichip module showing the first embodiment of the multichip-module fabrication method in an order of each process according to the present invention.

In each formation of the interconnection layers and the insulating layers, FIGS. 7 to 9 show that the interconnection layers are connected each other among the layers by internal-connection electrodes 25 (these electrodes are referred to as "vias"). In this embodiment, the vias 25 electrically make connections between the third interconnection layer 17 and the fourth interconnection layer 20, between the fourth interconnection layer 20 and the fifth interconnection layer 22, and between the fifth interconnection layer and the surface-conductive layer 24, respectively.

These vias 25 are general technologies as a method of connection among layers in multilayer-routing substrate. In detail description, after forming holes in the insulating layers which sandwich the interconnection layer to be connected, vias are formed by stuffing a conductive material into these holes. Therefore, when implementing a hole-forming process to form the vias 25, each hole 14 formed at the throughhole-forming location, can also be formed, and a fabrication method of these holes in each insulating layer is simple, so that the forming of the holes 14 does not cause the multichip-module fabrication process to be more complex.

By performing each process described above referring to FIGS. 3 to 9, a chip-mounting substrate 26 shown in FIG. 9, is formed. And the holes 14 are formed at the throughhole forming location in each insulating layer 12, 15, 17, 19, 21, 23. Thus when the chip-mounting substrate 26 is formed, a throughhole 27 is constructed coaxially with the holes 14 formed in each insulating layer 12, 15, 17, 19, 21, 23. This throughhole 27 is in the coaxial form vertically through the chip-mounting substrate 26, thus the bonding layer 11 is in exposure through the throughhole 27.

Figure 10:
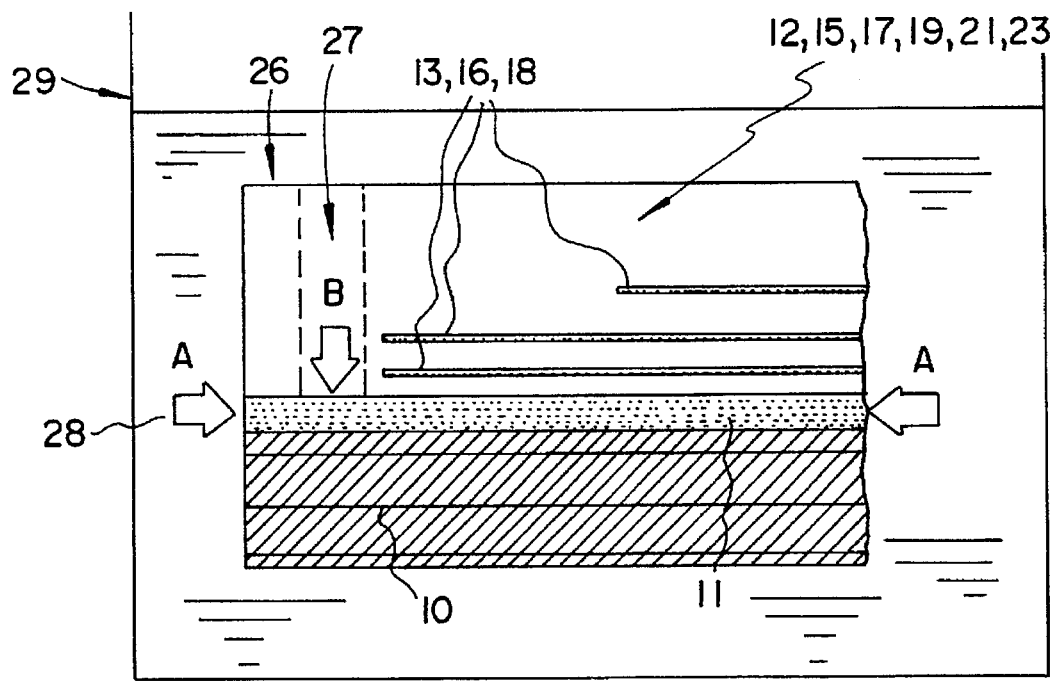
FIG. 10 is a cross-sectional view of the multichip module showing the first embodiment of the multichip-module fabrication method in an order of each process according to the present invention.

After the forming of the chip-mounting substrate 26, a supporting-base separating process is implemented, which is an essential part of the present invention method. To separate the supporting base from the chip-mounting substrate 26, as shown in FIG. 10, the chip-mounting substrate 26 being contacted with the supporting base 10 is dipped into the detaching medium (etching medium) 28 filled in an etching pool 29. At this time, a protection film (not shown in the figure) from the etching medium is disposed on the surface-conductive layer 24.

For the etching medium 28, when inorganic materials such as silicon-oxide film ($SiO_2$), phosphorus glass, soda glass, and lead (Pb) glass are used for the bonding-layer 11 material, hydrofluoric acid (HF), ammonium fluoride (NH$_4$F), and a liquid mixture of NH$_4$F and H$_3$PO$_4$ (a volume ratio of NH$_4$F and H$_3$PO$_4$ is approximately from ½ to 1/20) are suitable. And when using an epoxy resin as a main medium for the bonding-layer 11 material, butyl acetate and acetone are effective for the etching medium 28.

Figure 11:
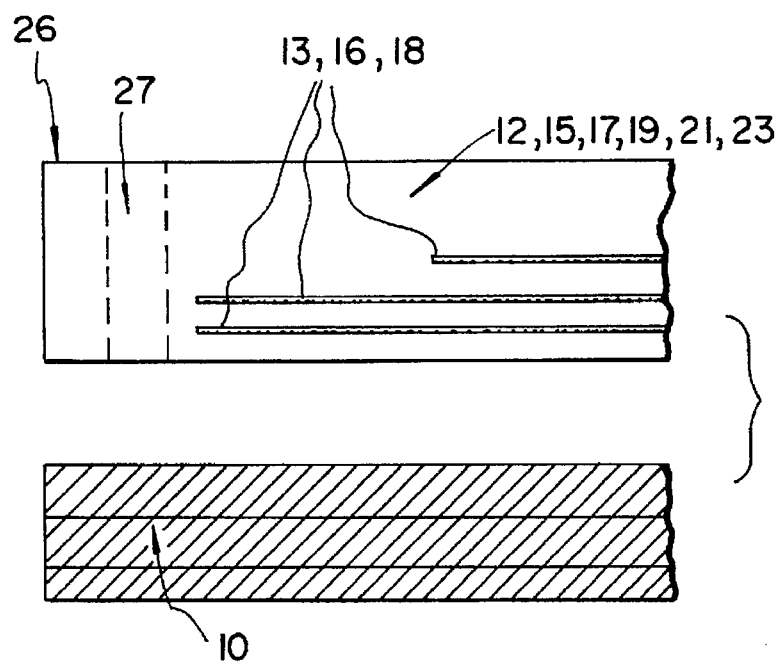
FIG. 11 is a cross-sectional view of the multichip module showing the first embodiment of the multichip-module fabrication method in an order of each process according to the present invention.

When the chip-mounting substrate 26 bonding with the supporting base 10 is dipped into the etching medium 28, the bonding layer 11 is etched by eroding reaction of the bonding layer 11 with the etching medium 28. Thus, the etching (eroding) of the bonding layer 11, as shown in FIG. 11, results in separation of the supporting base 10 from the chip-mounting substrate 26.

During this processing, throughhole 27 is formed in the coaxial form through the chip-mounting substrate 26, then the bonding layer 11 is in exposure through the throughhole 27. Therefore, the etching medium 28 directly reacts with a bonding area between the supporting base 10 and the chip-mounting substrate 26 through the throughhole 27 (a reacting direction is designated as an arrow B in FIG.10), as well as conventional reactions with side area of the bonding layer 11 (a reacting direction is designated as arrows A in FIG. 10). Thus, a reaction area of the bonding layer 11 with the etching medium 28 is increased, and the bonding layer 11 can be removed in a short time, so that the supporting base 10 may be also separate from the chip-mounting substrate 26 in a short time (FIG. 11).

And in this embodiment, entirely etching (eroding) the supporting base 10 is unnecessary, but only etching the bonding layer 11 is enough for the separation. The above also enables reduction of the separation time. Therefore, before the etching medium 28 permeates among the insulating layers 12, 15, 17, 19, 21, 23 constructing the chip-mounting substrate 26, the separation process can be completed, this fast operation can surely prevent detachment generated in the insulating layers 12, 15, 17, 19, 21, 23, and disconnection due to reaction of the etching medium 28 with the interconnection layers 13, 16, 18, 20, 22, 24. In addition, because the same supporting base 10 is usable for other multichip-module fabrication processes, it becomes unnecessary to conventionally form the supporting base 10 for each fabrication process of the multichip module, consequently the above enables a reduction of a device cost.

Figure 12:
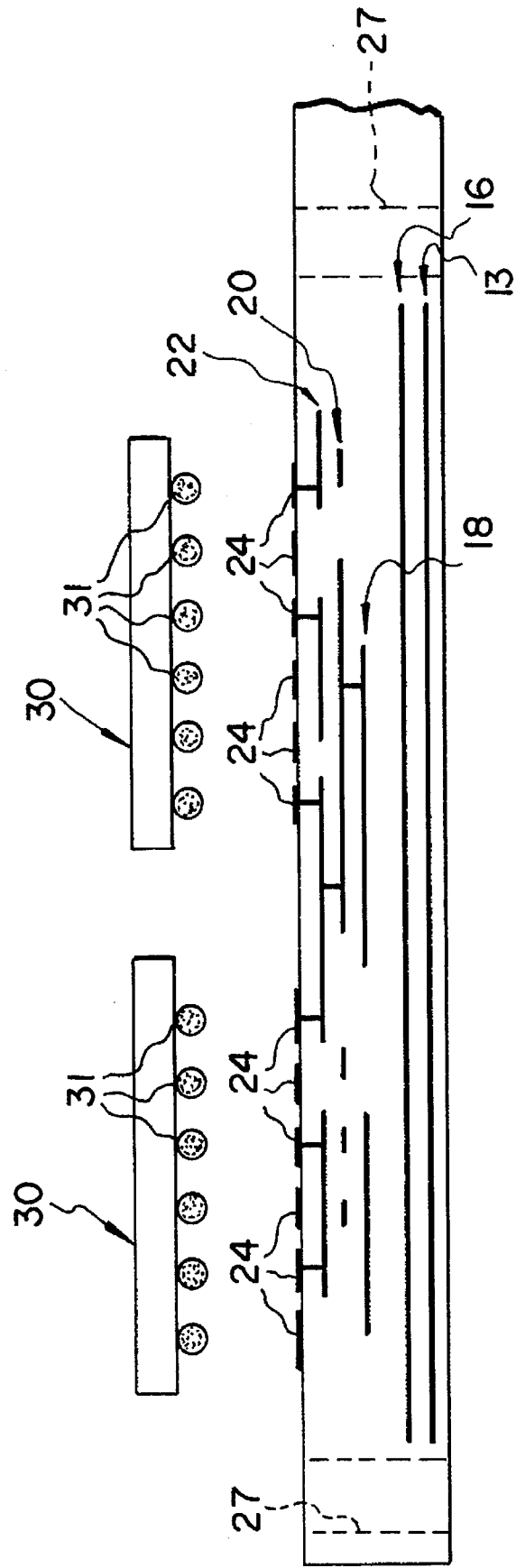
FIG. 12 is a cross-sectional view of the multichip module showing the first embodiment of the multichip-module fabrication method in an order of each process according to the present invention.

When the supporting base 10 is separated from the chip-mounting substrate 26, as shown in FIG. 12, the semiconductor chips 30 are mounted on the chip-mounting substrate 26 by connecting the surface-conductive layer 24 with the bumps 31 formed on the semiconductor chips 30. As a result, as shown in FIG. 13, a multichip module 32 is completed. In the multichip module 32 shown in FIG. 13B, a plurality of the throughholes 27 are formed in the chip-mounting substrate 26, but because a diameter of the throughhole 27 is made small between 100 μm to 300 μm, a large number of the throughholes 27 may not cause degradation of a structure strength of the chip-mounting substrate 26 and that of routing flexibility in the interconnection layers.

Next, an allocation rule for forming of the throughhole 27 in the chip-mounting substrate 26 will be described below.

The allocation rule is an essential condition for allocating the throughhole 27, and indicates a maximum number of the throughholes 27 to be constructed in the chip-mounting substrate 26. As described above clearly, the larger the number of the throughhole 27 is, the shorter a separation time of the supporting base 10 from the chip-mounting substrate 26 is. This feature is effective for preventing damage of the insulating layers 12, 15, 17, 19, 21, 23 and the interconnection layers 13, 16, 18, 20, 22, 24.

However, when the number of the throughholes 27 is large, a mechanical-structure strength of the chip-mounting substrate 26 becomes weak because of a reduction of bonding force between the supporting base 10 and the chip-mounting substrate 26, consequently before construction of the insulating layers and the interconnection layers is completed, a separation of the supporting base 10 from the chip-mounting substrate 26 may occur, and this defeats the purpose of forming the supporting base 10.

Therefore, for the above reasons, it is necessary to properly set the number of the throughholes 27. In the following, a method for getting the proper number of the throughholes 27 will be described.

The allocation rule of the throughhole is generally determined by reaction speed (permeation speed) of the etching medium 28 and an acceptable detachment time in the fabrication process. Now, on the assumption that the reaction of the etching medium 28 is oriented to a constant direction, reaction length (permeation length) is described in a following equation;

$$r = \epsilon \cdot t \tag{1}$$

where r is reaction length (permeation length), $\epsilon$ is reaction speed (permeation speed), and t is a reaction time (permeation time).

As shown in FIG. 13A and FIG. 13B, when assuming a supposed area R being equivalent to the chip-mounting substrate 26, and also assuming that a permeation part of the etching medium 28 exists in points P and Q within the area R, the permeation part of the etching medium 28 will be extended around the points P and Q according to the above described equation (1).

And a relation between a bonding force f bonding the supporting base 10 with the chip-mounting substrate 26 and a bonding strength σ (bonding force per a unit area), is described as follows;

$$f = \sigma \cdot \Sigma \tag{2}$$

where Σ is an area of a bonding part.

Particularly, when the bonding strength σ is constant, the bonding force f is determined by the area Σ. Therefore, on the assumption that an area (minimum bonding area) is defined as Σ$_0$, which is needed to get the bonding force for maintaining a minimum strength experimentally obtained, a separation of the supporting base 10 from the chip-mounting substrate 26 occurs on condition that;

$$\Sigma_0 > \Sigma \tag{3}$$

Figure 15:
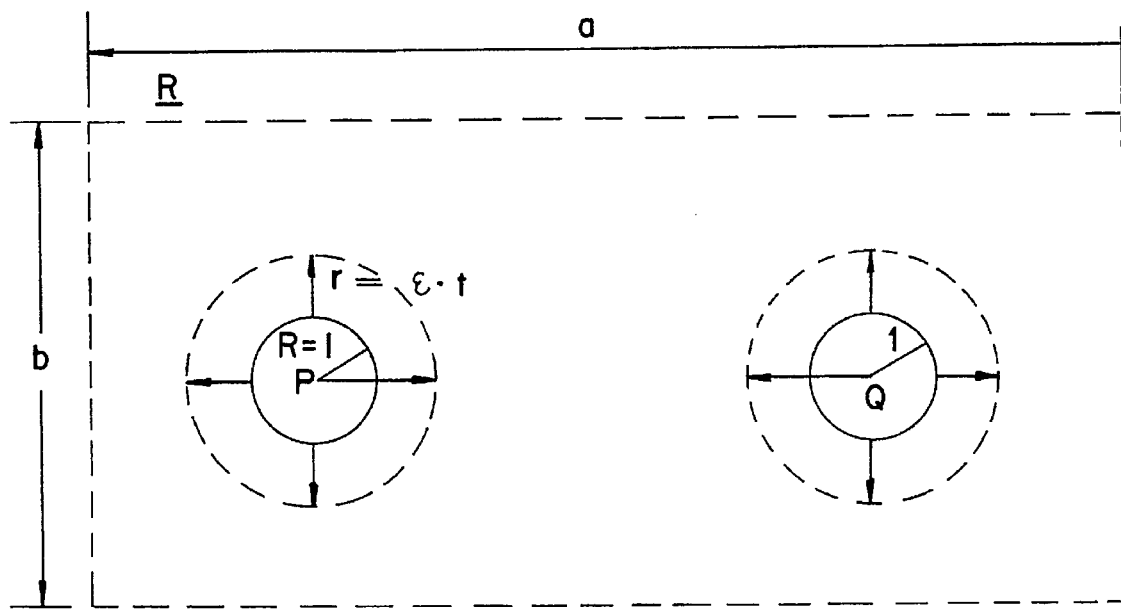
FIG. 15 is an illustration for explaining a proper number of throughholes to be formed in a chip-mounting substrate.

Then, referring to FIG. 15 the area of the bonding part is calculated. For simplification of the calculation, it assumes that the permeation part (point P and point Q) of the etching medium 28 is a unit circle with a radius of one (R=1), and n permeation parts (being corresponding to the throughhole 27) exist in the area R. The area Σ of the bonding part is described as follows;

$$\Sigma = S - n \cdot (\pi \cdot R^2) - n \cdot \pi \cdot (2 \cdot \epsilon \cdot R \cdot t + \epsilon^2 \cdot t^2) \tag{4}$$
$$= S - n \cdot \pi - n \cdot \pi \cdot (2 \cdot \epsilon \cdot t + \epsilon^2 \cdot t^2)$$

where S in the equation (4) is an area of the area R. In FIG. 15, if a shape of the area R is rectangular, where a horizontal-side length is "a" and a vertical-side length is "b";

$$S = a \cdot b \quad (5)$$

is obtained. Simultaneously combining the equations (3) and (4), and subsequently substituting the equation (5) for the combination;

$$\Sigma_{o > S - n \cdot \pi - n \cdot \pi}(2 \cdot \epsilon \cdot t + \epsilon^2 \cdot t^2)$$

$$\Sigma_{o > a \cdot b - n \cdot \pi - n \cdot \pi}(2 \cdot \epsilon \cdot t + \epsilon^2 \cdot t^2) \quad (6)$$

is obtained.

Then, transforming the equation (6) in regard to the number n of the permeation parts (throughholes);

$$n > (a \cdot b - \Sigma_0)/(\pi \cdot (1 - \epsilon \cdot t)^2) \quad (7)$$

is achieved. From the above equation (7), the number n of the permeation parts (throughholes 27) formed in the area R (chip-mounting substrate 26) can be derived. The number n in FIG. 9 indicates a maximum number of permeation parts (a number of the throughholes 27).

On the other hand, a feasible number of the permeation parts (the number of the throughholes 27) in each of a horizontal side and a vertical side of the area R is obtained by the following equations;

$$n_a < a/(2 \cdot (1 + \epsilon \cdot t)) \quad (8)$$

$$n_b < b/(2 \cdot (1 + \epsilon \cdot t)) \quad (9)$$

where $n_a$ is a number of the permeation parts (a number of the throughholes 27) in the horizontal side, $n_b$ is a number of the permeation parts (a number of the throughholes 27) in the vertical side.

In the case of the horizontal side, a range of bonding-strength degradation due to the permeation of the etching 28 is shown as a circular region around each point of P and Q designated by dotted lines. The diameter S of the circular region is described as follows;

$$S = 2 \cdot (1 + \epsilon \cdot t) \quad (10).$$

Therefore, when the circular region with a degraded bonding strength is consecutively allocated in the horizontal side, the separation may occur due to degradation of the bonding strength between the supporting base 10 and the chip-mounting substrate 26. To prevent such an early separation, a following equation needs to be satisfied;

$$a > n_a \cdot 2 \cdot (1 + \epsilon \cdot t) \quad (11).$$

Then, transforming the above equation (11) in regard to the number $n_a$ of the horizontal permeation parts, the equation (8) is obtained. In regard to the number $n_b$ of the vertical permeation parts, the equation (9) is obtained by the same way.

The above description will clarify that the proper number of the throughhole 27 formed in the chip-mounting substrate 26 needs to be set so as to simultaneously satisfy the equations (7), (8), and (9).

According to the present invention, following effects are obtainable.

According to the multichip-module fabrication method, the throughhole is formed through the insulating layers to the top of the bonding layer in the throughhole-forming process, so that the treatment medium for removing of the bonding layer can react the bonding layer through the throughhole in the supporting-base separating process. The above enables separation of the supporting base from the chip-mounting substrate by only removing the bonding layer with the treatment medium, and the separation may be completed in a short time. Therefore, the above separation processing can be completed before the treatment medium permeates into the interlayer-insulating film being a component of the chip-mounting substrate, and thus these results enables sure prevention of the detachment between the interlayer-insulating films and the disconnection in the interconnection layers.

And according to the multichip-module fabrication method, the chip-mounting-substrate forming process and the throughhole-forming process are carried out together by forming the throughhole during forming of the interconnection layers in the form of layers, so that the above enables simplification of the multichip-module fabrication process.

And according to the multichip-module fabrication method, during forming of a plurality of the throughholes, a total number (n) of the throughholes formed in the chip-mounting substrate and each number ($n_a$, $n_b$) of the throughholes allocated in two neighboring sides of the chip-mounting substrate are set to calculated numbers according to the given equations, consequently in the each multichip-module fabrication process the chip-mounting substrate is strongly supported by the supporting base, and in the supporting-base separating process the separation of the supporting base from the chip-mounting substrate may be carried out in a short time.

And according to the multichip-module fabrication method, the bonding layer and the supporting base are constructed as one member by forming the bonding layer with the same materials as that of the supporting base, so that a structure of the chip-mounting substrate with which the supporting base is contacted may be simplified.

Further according to the multichip module, the through holes are formed in the chip-mounting substrate, the treatment medium for removing of the supporting base from the chip-mounting substrate is leaded into these throughholes, the supporting base which supports the chip-mounting substrate during forming the chip-mounting substrate, so that the detachment between the interlayer-insulating films and the disconnection in the interconnection layer may be surely prevented.

Further, the present invention is not limited to these embodiments, but various variations and modifications may be made without departing from the scope of the present invention.

What is claimed is:

1. A multichip module, comprising:

at least one semiconductor chip;

a chip-mounting substrate supporting the semiconductor chip, said chip-mounting substrate being constructed with at least one interlayer-insulating layer and at least one interconnection layer, at least one throughhole directing a treatment medium into a bonding layer connecting a supporting base and said chip-mounting substrate in order to melt the bonding layer, and a flat and smooth under-surface formed on said chip-mounting substrate due to melting of the bonding layer; and bumps interposed between said semiconductor chip and said chip-mounting substrate for fixing said semiconductor chip to said chip-mounting substrate and forming at least an electrical connection between said semiconductor chip and said interconnection layer of said chip-mounting substrate;

wherein the supporting base supports said chip-mounting substrate during information of said chip mounting substrate, and after said chip-mounting substrate is formed, the supporting base is removed from said chip-mounting substrate by leading the treatment medium into said throughhole and melting the bonding layer, and subsequent to removal of the supporting base, said semiconductor chip is mounted on said chip-mounting substrate through said bumps to form the multichip module.

2. The multichip module as claimed in claim 1, wherein a total number (n) of said throughholes formed in said chip-mounting substrate and each number ($n_a$, $n_b$) of the throughholes allocated in two neighboring sides of said chip-mounting substrate are set in accordance with following equations:

$$n > (a \cdot b - \Sigma_0)/(\pi \cdot (1+\epsilon \cdot t)^2);$$

$$n_a < a/(2 \cdot (1+\epsilon \cdot t)); \text{ and}$$

$$n_b < b/(2 \cdot (1+\epsilon \cdot t));$$

where a is length of one side the chip-mounting substrate, b is length of the neighboring side of the chip-mounting substrate, $\Sigma_0$ is a minimum bonding area of the bonding layer, $\epsilon$ is reaction speed of the treatment medium, and t is a reaction time of the treatment medium.

* * * * *